US005621236A

United States Patent [19]

Choi et al.

[11] Patent Number: 5,621,236
[45] Date of Patent: Apr. 15, 1997

[54] GATE-TO-DRAIN OVERLAPPED MOS TRANSISTOR FABRICATION PROCESS AND STRUCTURE THEREBY

[75] Inventors: Young-Seok Choi, Pucheon; Kwang-Dong Yu, Incheon; Tae-Young Won, Seoul, all of Rep. of Korea

[73] Assignee: SamSung Electronics Co., Ltd., Suwon, Rep. of Korea

[21] Appl. No.: 119,671

[22] Filed: Sep. 3, 1993

Related U.S. Application Data

[62] Division of Ser. No. 726,189, Jul. 5, 1991, Pat. No. 5,256,586.

[30] Foreign Application Priority Data

May 23, 1991 [KR] Rep. of Korea ............... 1991-8363

[51] Int. Cl.$^6$ ......................................... H01L 29/76
[52] U.S. Cl. ........................ 257/389; 257/387; 257/408; 257/413
[58] Field of Search ............................ 257/386, 387, 257/388, 389, 401, 408, 412, 413

[56] References Cited

U.S. PATENT DOCUMENTS

| | | | |
|---|---|---|---|
| 4,329,706 | 5/1982 | Crowder et al. ................ | 257/756 |
| 4,868,617 | 9/1989 | Chiao et al. .................... | 257/900 |
| 5,013,675 | 5/1991 | Shen et al. ..................... | 437/44 |
| 5,024,959 | 6/1991 | Pfiester .......................... | 437/34 |
| 5,120,673 | 6/1992 | Itoh ................................ | 437/44 |
| 5,146,291 | 9/1992 | Watabe et al. ................. | 257/389 |
| 5,159,417 | 10/1992 | Ozaki ............................. | 257/408 |
| 5,214,305 | 5/1993 | Huang et al. .................. | 257/413 |

FOREIGN PATENT DOCUMENTS

| | | | |
|---|---|---|---|
| 6132576 | 2/1986 | Japan .................... | 257/408 |
| 6425475 | 1/1989 | Japan .................... | 257/408 |
| 3-120835 | 5/1991 | Japan . | |

OTHER PUBLICATIONS

*Silicon–Gate LOCOS NMOS Proccess*, "Modem MOS Technology", Section 7–4, pp. 138–143, Jan. 1990.

*Primary Examiner*—Mark V. Prenty
*Attorney, Agent, or Firm*—Robert E. Bushnell, Esq.

[57] ABSTRACT

A method for fabricating a gate-to-drain overlapped MOS transistor in which gate-to-drain capacitance is lower and a structure thereby. A pad oxide layer is formed over a substrate having a first conductive layer with a first pattern formed on a first gate oxide layer, and etchback process is performed until surface part and a predetermined upper parts of the both side walls of the first conductive layer is exposed. As a result, a second conductive layers with a second pattern is formed and a second gate oxide layer thicker than the first gate oxide layer is formed.

31 Claims, 3 Drawing Sheets

GATE-TO-DRAIN OVERLAPPED MOS TRANSISTOR FABRICATION PROCESS AND STRUCTURE THEREBY

This is a divisional of application Ser. No. 07/726,189, filed Jul. 5, 1991 now U.S. Pat. No. 5,256,586.

This application makes reference to our co-pending application entitled GATE-TO-DRAIN-OVERLAPPED MOS TRANSISTOR FABRICATION PROCESS earlier filed in the United States Patent & Trademark Office in Jul. 5, 1991 and assigned Ser. No. 07/726,189, issued as a United States Patent on Oct. 26, 1993, and to our application filed in the Korea Industrial Property Office of the Republic of Korea on May 23, 1991 and assigned Ser. No. 8363/91, for the purposes of obtaining the benefit conferred under Title 35 United States Code §§119, 120 and 121.

BACKGROUND OF THE INVENTION

The present invention relates to a semiconductor device, and particularly to a process for fabricating a gate-to-drain overlapped metal-oxide-semiconductor (MOS) transistor and a structure thereby.

Lightly doped drain (LDD) structures with complete overlap between a low concentration diffusion region and a gate thereof such as an Inverse-T Lightly Doped Drain structure (ITLDD) and a gate overlapped drain (GOLD) structure have been proposed as ways to improve hot carrier reliability and performance of submicron MOS.

The ITLDD and GOLD structures are disclosed in International Electron Device Meeting (IEDM) Tech. Dig., 1989, pp 769–772, IEDM Tech. Dig., 1986, pp 742–745, IEDM Tech. Dig., 1987, pp 38–41, and IEDM Tech. Dig., 1989, pp 617–620,.

FIG. 1 is a cross-sectional View of a conventional MOS transistor of ITLDD structure. Diffusion regions 6 of second conductive type are isolated from each other by the channel region which is formed within a first conductive type semiconductor substrate 1, and an insulation layer 7 is formed on the surface of the substrate 1. An inverse T-shaped gate 9 is disposed over the channel region and the diffusion region adjacent to the channel region, and insulation layer spacer regions 11 are formed on the external side walls of the gate 9. In this case, the diffusion regions 6 include low concentration regions 3 and high concentration regions 5, and the gate 9 and the low concentration regions 3 overlap.

By such structure as stated above, the effect of improving a current characteristic and reducing electric field between the insulation layer and the silicon substrate can be obtained. However, the problem is that gate-to-drain overlap capacitance $C_{gdo}$ increases by gate-to-drain overlap so as to delay transmission time.

SUMMARY OF THE INVENTION

It is therefore an object of the present invention to provide a structure of MOS transistor wherein gate-to-drain capacitance is minimized and fabrication process therefor.

According to an aspect of the present invention, an inventive MOS transistor has thicker insulation layer formed in the region where a gate and a drain are overlapped, by forming an oxide insulation layer over a substrate after forming a conductive layer with a first pattern on the substrate.

BRIEF DESCRIPTION OF THE DRAWINGS

For a better understanding of the invention and to show how the same may be carried into effect, reference will now be made, by way of example, to the accompanying diagrammatic drawings, in which.

DETAILED DESCRIPTION OF THE INVENTION

Figure 1:
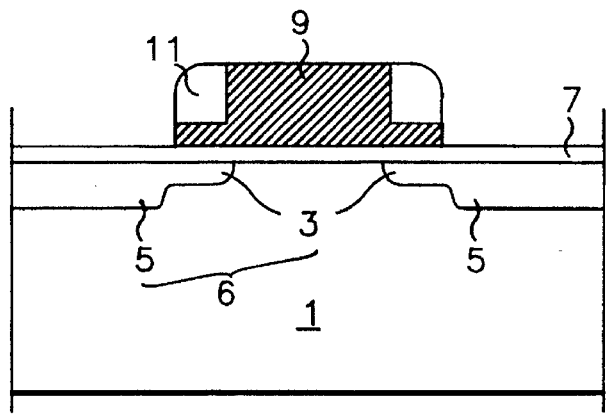
FIG. 1 is a cross-sectional view of a conventional MOS transistor structure.
Figure 2:
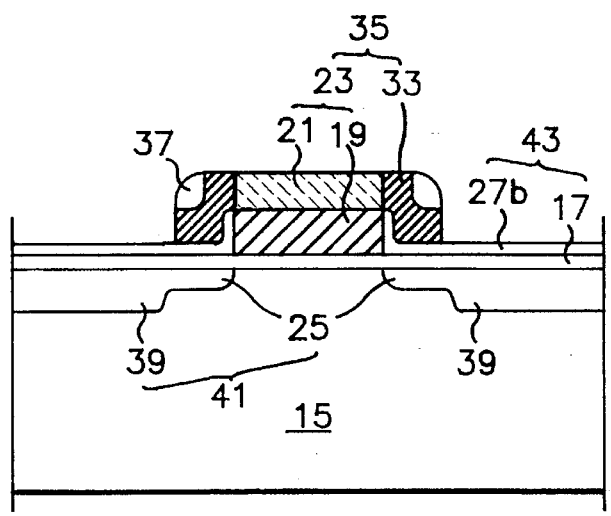
FIG. 2 is a cross-sectional view of a MOS transistor structure according to the present invention.

Referring to FIG. 2, Diffusion regions 41 of second conductive type are isolated from each other by the channel region formed within a first conductive type semiconductor substrate 15, including low concentration regions 25 and high concentration regions 39, and a first insulation layer 17 with a first thickness is formed on the surface of a substrate. A first conductive layer 23 with a first pattern is formed on the first gate insulation layer 17, including a lower conductive layer 19 made of poly-crystalline silicon and an upper conductive layer 21 made of "fire-resisting" refactory like silicide. Second conductive layers 33 with a second pattern are isolated from lower parts of the external side wells of the first conductive layer 23 by means of gate insulation layers 27b with a second thickness, and isolated from the substrate 15 to the extent of third thickness which is equal to sum of the first thickness of the first gate insulation layer 17 and the second thickness of the gate insulation layers 27b, being attached to the upper parts of the external side wells of the first conductive layer 23. The above first conductive layer 23 and second conductive layers 33 correspond to a gate 35. Here, an insulation layer spacer regions 37 are formed on both external side walls of the gate 35.

As shown of FIG. 2, second gate insulation layers 43 which include the first gate insulation layer 17 and the gate insulation layers 27b, the region where the gate and a drain are overlapped, are thicker than the gate insulation layer formed on the channel region. Such structure is called a gate-overlapped-on-twin-oxide (GOTO) LDD structure.

Figure 3A:
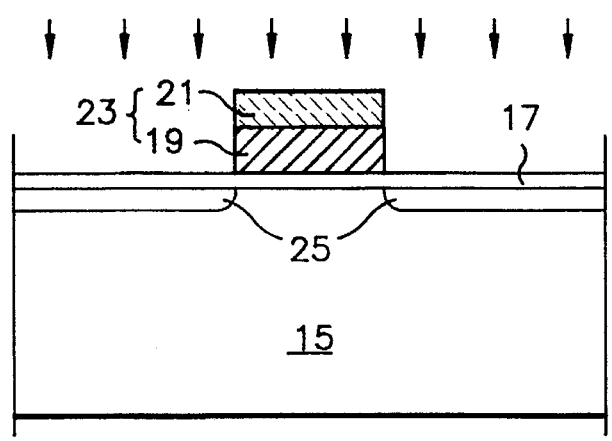
FIG. 3A to 3F illustrate fabrication processes of the MOS transistor according to the present invention.

In FIG. 3A, a first gate oxide layer 17 of about 150 Å–200 Å thickness is formed on the surface of p-type semiconductor substrate 15, and then the conductive layer 23 with the first pattern is formed on the first gate oxide layer 17. In this case, the conductive layer 23 is formed by stacking a tungsten silicide layer 21 of about 1500 Å thickness on a first poly-crystalline silicon layer 19 of about 2500 Å thickness, in order to improve an electric characteristic. Then, the low concentration source and drain regions 25 are formed by implanting n-type impurities from the upper part of the substrate 15. In this case, the conductive layer 23 with first pattern serves as a mask.

Figure 3B:
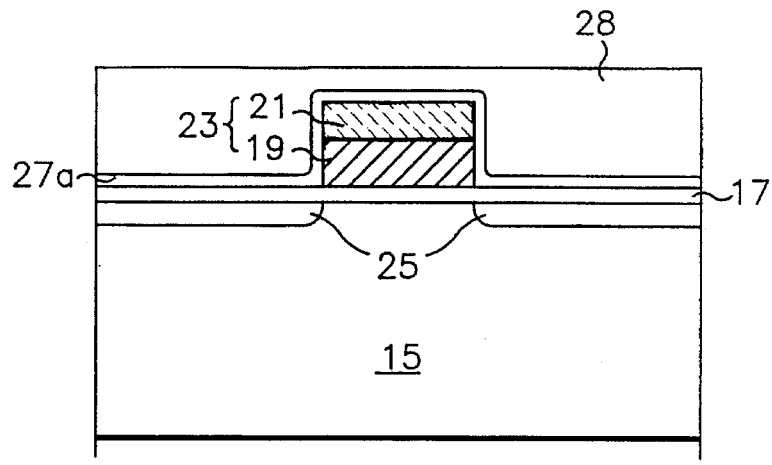

In FIG. 3B, a thin pad oxide layer 27a of about 150 Å–200 Å thickness is formed by thermal oxidization on the surfaces of the conductive layer 23 and the first gate oxide layer 17, and then the first gate oxide layer 17 is covered with photoresist 28.

Figure 3C:
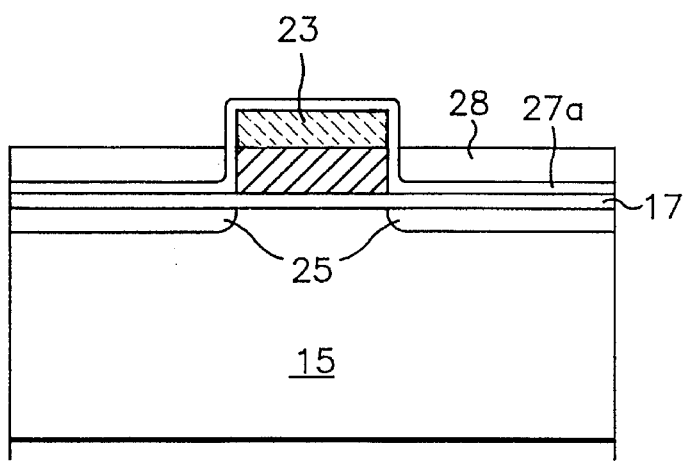

In FIG. 3C, the photoresist 28 is etched to a predetermined thickness by an etchback process, until the pad oxide layer 27a formed on the surface and on the upper part of the side walls of the first conductive layer 23 is exposed.

Figure 3D:
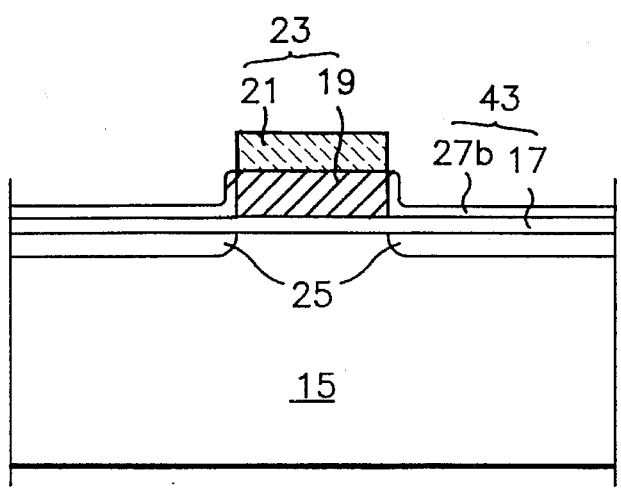

In FIG. 3D, the exposed pad oxide layer 27a is removed by wet or dry etching and then the photoresist 28 remaining over the substrate 15 is removed. By the above process, the second gate oxide layers 43 of 220 Å–300 Å thickness are formed on the surface of the low concentration source and drain regions 25 by forming pad oxide layers 27b on the first gate oxide layer 17.

The photoresist 28 and pad oxide layer 27a are etched in consecutive order, in FIG. 3C and 3D, but the photoresist 28 and pad oxide layer 27a can be simultaneously etched in other embodiment of the present invention. That is, an etchback process is carried out under condition that the etching rate of the pad oxide layer is higher than that of photoresist by using carbon tetrafluoride $CF_4$ or oxygen $O_2$, to thereby simultaneously remove the pad oxide layer formed on the surface and on the side walls of the tungsten silicide layer 21.

Furthermore, only the pad oxide layer formed on the side walls of the first poly-crystalline silicon layer 19 is let to remain in one embodiment of the present invention, but the height of the pad oxide layer remaining on the side walls of the conductive layer with first pattern can be changed in other embodiment of the present invention.

Figure 3E:
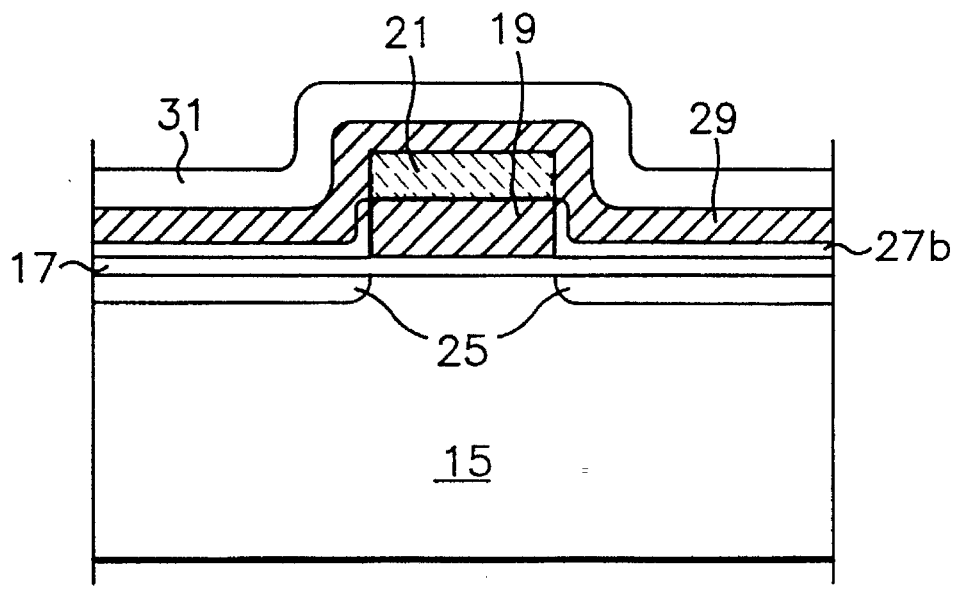

In FIG. 3E, a second poly-crystalline silicon layer 29 of 500 Å–2000 Å thickness and a low temperature oxide layer 31 of 1000 Å–2000 Å thickness are formed on the first conductive layer 23 and on the second gate oxide layers 43.

Figure 3F:
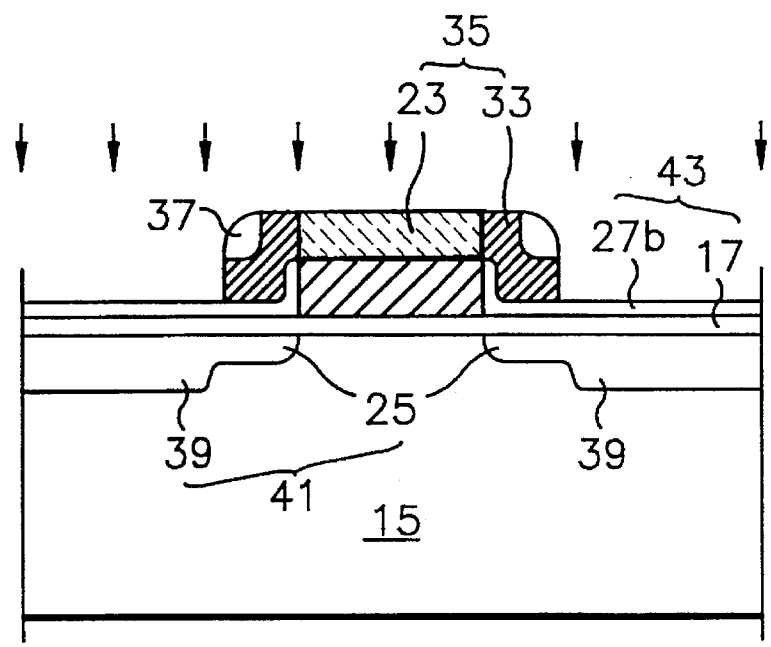

Next, in FIG. 3F, a reactive ion etching (RIE) process is performed until the surface of the tungsten silicide layer 21 is exposed. Then the low temperature oxide spacer regions 37 are formed on both external side walls, at which the side walls extend upwardly, of the second poly-crystalline silicon layer 29. In this case, the low temperature oxide layer 31 and the second poly-crystalline silicon layer 29 other than lower and inner portions of the low temperature oxide spacer regions 37 are removed, thereby to form the second conductive layers 33. Thereafter, the high concentration source and drain regions 39 are formed, by implanting the n-type impurities into the substrate 15, by using the gate 35 formed the first and second pattern conductive layers 23, 33 as the mask.

The capacitance C of the region where the gate and the drain are overlapped can be expressed by $C=\epsilon A/d$, here the symbol $\epsilon$ represents a dielectric constant, the symbol A represents an area where the gate and the drain are overlapped, and the symbol d represents thickness of insulation layer in the region where a gate and a drain are overlapped. As described the above formula, the capacitance C is proportional to area A and inversely proportional to thickness d. If thickness of the insulation layers in the regions where the gate and the drain are overlapped is respectively expressed by d1 in the conventional invention and by d2 in the present invention, the thickness d2 is much greater than the thickness d1, in the same area A. Therefore, the transistor according to the present invention has greatly reduced capacitance.

As mentioned hereinabove, the present invention having the structure of gate-to-drain overlapped MOS transistor forms the second gate oxide layer thicker than the first gate, on the surface of source and drain region, by performing the process which forms the first gate oxide layer on the surface of the substrate and forms the conductive layer in first pattern on the pad oxide layer, and the process which performs etchback until the surface and the upper portion of the side walls of the conductive layer with the first pattern is exposed and covers the second poly-crystalline silicon layer thereover.

Consequently, the present invention has an effect of reducing gate-to-drain capacitance by the overlapping of a gate and a drain. The present invention also has another effect of increasing the operation characteristic of element by minimizing the transmission delay time of MOS transistor. Particularly, the present invention has the advantage of making a process easy by forming a second gate oxide layer without supplementing a mask.

While the invention has been particularly shown and described with reference to a preferred embodiment, it will be understood by those skilled in the art that modifications in detail may be made without departing from the spirit and scope of the invention.

What is claimed is:

1. A gate-to-drain overlapped MOS transistor, comprising:

a substrate of a first conductivity type;

first and second diffusion regions of a second conductivity type, each of said first and second diffusion regions having first and second doped regions doped with different concentrations of impurities, disposed within said substrate, separated and spaced-apart from each other by a channel region formed within said substrate;

a first gate insulation layer formed on the surface of said substrate;

a first conductive layer with a first pattern comprising an upper portion exhibiting a first conductive material contiguously formed on a lower portion exhibiting a second conductive material different from said first conductive material, said lower portion being formed on said first gate insulation layer over said channel region;

a second gate insulation layer formed directly on a sidewall of said lower portion of said first conductive layer, and extended outwardly from said lower portion of said first conductive layer to cover said first gate insulation layer above said first and second diffusion regions; and a second conductive layer formed directly on a side wall of said upper portion of said first conductive layer, and extended outwardly from said upper portion of said first conductive layer to cover a portion of said second gate insulation layer above said first and second diffusion regions, said second conductive layer being isolated, separated and spaced-apart from said lower portion of said first conductive layer by said second gate insulation layer, and from the surface of said substrate by said first and second gate insulation layers having a combined thickness substantially equal to twice a thickness of said first gate insulation layer.

2. A gate-to-drain overlapped MOS transistor, comprising:

a substrate of a first conductivity type;

first and second diffusion regions of a second conductivity type, each having first and second doped regions doped with different concentrations, said diffusion regions being isolated from each other by a channel region formed within said substrate; and a first gate insulation layer formed on the surface of said channel region;

a gate comprising a first conductive layer comprised of a lower portion and an upper portion formed upon said lower portion and constructed of a material different from said lower portion, said lower portion being separated from the surface of said channel region by said first gate insulation layer having a thickness in the range of approximately 150–200 Å, and a second conductive layer electrically connected to said upper portion of said first conductive layer but isolated and spaced-apart from said lower portion of said first conductive layer and said substrate second gate insulation layer formed over said first and second diffusion regions of said substrate, said second conductive layer extending outwardly from said upper portion of said first conductive layer toward both said first and second diffusion regions of said substrate but separated from the surface of said substrate by said first gate insulation layer and said second gate insulation layer having a combined thickness in the range of approximately 220–300 Å.

3. A gate-to-drain overlapped MOS transistor, comprising:

a substrate of a first conductivity type;

first and second diffusion regions of a second conductivity type spaced apart from each other by a channel region, for respectively forming source and drain regions of said MOS transistor, said first and second diffusion regions each comprising a first doped portion implanted in said substrate with a first concentration of ions of N-type impurities and a second doped portion implanted in said substrate below said first doped portion with a second concentration of ions of N-type impurities greater than said first concentration;

a first gate insulation layer formed on a surface of said substrate covering said channel region, said first diffusion region and said second diffusion region;

a first conductive layer formed on said first gate insulation layer over said channel region, said first conductive layer comprising an upper portion exhibiting a first conductive material contiguously formed on a lower portion exhibiting a second conductive material different from said first conductive material, said upper portion having a thickness substantially greater than one-half of a thickness of said lower portion;

a second gate insulating layer formed on a side wall of said lower portion of said first conductive layer, extending over said first gate insulating layer to cover said first and second diffusion region;

a second conductive layer formed on a side wall of said upper portion of said first conductive layer, extending outwardly from said upper portion of said first conductive layer to cover a portion of said second gate insulating layer above said first and second diffusion regions, said second conductive layer being physically isolated from said lower portion of said first conductive layer by said second gate insulating layer and from the surface of said substrate by said first and second gate insulating layers;

an oxide layer formed on a portion of said second conductive layer; and said second doped portion of said first diffusion region being separated from said second doped portion of said second diffusion region by an area defined by the combination of said oxide layer, said second conductive layer and said first conductive layer.

4. A gate-to-drain overlapped MOS transistor, comprising:

a substrate of a first conductivity type;

first and second diffusion regions of a second conductivity type spaced apart from each other channel region, for respectively forming source and drain regions of said MOS transistor, said first and second diffusion regions each comprising a first doped portion implanted in said substrate with a first concentration of ions of N-type impurities and a second doped portion implanted in said substrate below said first doped portion with a second concentration of ions of N-type impurities greater than said first concentration;

a first gate insulation layer formed on a surface of said substrate covering said channel region, said first diffusion region and said second diffusion region;

a first conductive layer formed on said first gate insulation layer over said channel region, said first conductive layer comprising an upper portion exhibiting a first conductive material contiguously formed on a lower portion exhibiting a second conductive material different from said first conductive material, said upper portion having a thickness substantially greater than one-half of a thickness of said lower portion;

a second gate insulating layer formed on a side wall of said lower portion of said first conductive layer, extending over said first gate insulating layer to cover said first and second diffusion region;

a second conductive layer formed on a side wall of said upper portion of said first conductive layer extending outwardly from said upper portion of said first conductive layer to cover a portion of said second gate insulating layer above said first doped portion but not above said second doped portion of said first and second diffusion region, said second conductive layer being physically isolated from said lower portion of said first conductive layer by said second gate insulating layer and from the surface of said substrate by said first and second gate insulating layers; and an oxide layer formed on a portion of said second conductive layer.

5. A gate-to-drain overlapped MOS transistor, comprising:

a substrate of a first conductivity type;

first and second diffusion regions of a second conductivity type spaced apart from each other by a channel region, for respectively forming source and drain regions of said MOS transistor, said first and second diffusion regions each comprising a first doped portion implanted in said substrate with a first concentration of ions of N-type impurities and a second doped portion implanted in said substrate below said first doped portion with a second concentration of ions of N-type impurities greater than said first concentration;

a first gate insulation layer formed on a surface of said substrate covering said channel region, said first diffusion region and said second diffusion region;

a first conductive layer formed on said first gate insulation layer over said channel region, said first conductive layer comprising an upper portion exhibiting a first conductive material contiguously formed on a lower portion exhibiting a second conductive material different from said first conductive material, said upper portion having a thickness substantially greater than one-half of a thickness of said lower portion;

a second gate insulating layer formed on a side wall of said lower portion of said first conductive layer, extending over said first gate insulating layer to cover said first and second diffusion region;

a second conductive layer formed on a side wall of said upper .portion of said first conductive layer, extending outwardly from said upper portion of said first conductive layer to cover a portion of said second gate insulating layer above said first and second diffusion regions, said second conductive layer being physically isolated from said lower portion of said first conductive layer by said second gate insulating layer and from the surface of said substrate by said first and second gate insulating layers;

an oxide layer formed on a portion of said second conductive layer; and said second gate insulating layer formed above said second doped portion of said first and second diffusion regions being not covered by said oxide layer and said second conductive layer.

6. A gate-to-drain overlapped MOS transistor, comprising:

a substrate of a first conductivity type;

first and second diffusion regions of a second conductivity type formed in said substrate, each of said first and second diffusion regions having first and second doped regions successively doped with different concentrations of impurities, said first and second diffusion regions being separated and spaced-apart from each other by a channel region;

a first gate insulation layer formed on said substrate;

a first conductive layer formed on said first gate insulation layer over said channel region, said first conductive layer comprising a lower conductive portion of a first conductive material and an upper conductive portion of a second conductive material different from said first conductive material for forming a gate electrode;

a second gate insulation layer formed on a side wall of said lower conductive portion of said gate electrode, extending outwardly to cover said first gate insulation layer over said first and second diffusion regions; and a second conductive layer formed on a side wall of said upper conductive portion of said gate electrode, isolated from said lower conductive portion of said gate electrode by said second gate insulation layer, and extended outwardly from said upper conductive portion of said gate electrode toward said first and second diffusion regions of said substrate but isolated from the surface of said substrate by said first and second insulation layers exhibiting a combined thickness substantially equal to twice a thickness of each of said first and second insulation layers individually.

7. A gate-to-drain overlapped MOS transistor, comprising:

a substrate of a first type conductivity;

first and second diffusion regions of a second type conductivity formed in said substrate and spaced apart from each other by a channel region, each of said first and second diffusion regions having a first doped portion and a second doped portion, for forming source and drain regions of said MOS transistor;

a first gate insulation layer formed on said substrate covering the top surface of said channel region, said first diffusion region and said second diffusion region;

a first conductive layer formed on said first gate insulation layer, and comprising an upper portion made of a tungsten silicide layer contiguously formed on a lower portion made of polysilicon layer;

a second gate insulation layer formed on said first gate insulation layer over said first diffusion region, over said second diffusion region, and on a side wall of said lower portion of said first conductive layer; and a second conductive layer formed on a side wall of said upper portion of said first conductive layer, isolated and spaced apart from said lower portion of said first conductive layer by said second gate insulation layer, said second conductive layer being further extended outwardly from said upper portion of said rust conductive layer toward said first and second diffusion regions of said substrate but isolated from the surface of said substrate by said first and second gate insulation layers having a combined thickness substantially equal to twice a thickness of each of said first and second gate insulation layers individually.

8. A gate-to-drain overlapped MOS transistor, comprising:

a substrate of a first type conductivity;

first and second diffusion regions of a second type conductivity formed in said substrate and spaced apart from each other by a channel region, each of said first and second diffusion regions having a first doped portion and a second doped portion, for forming source and drain regions of said MOS transistor;

a first gate insulation layer formed on said substrate covering the top surface of said channel region, said first diffusion region and said second diffusion region;

a first conductive layer formed on said first gate insulation layer over said channel region, and comprising an upper portion made of a first conductive material formed on a lower portion made of a second conductive material different from said first conductive material, said upper portion having a thickness substantially greater than one-half of a thickness of said lower portion;

a second gate insulation layer formed on a side wall of said lower portion of said first conductive layer, and extended coextensively with said first gate insulation layer over said first and second diffusion regions; and a second conductive layer formed on a side wall of said upper portion of said first conductive layer, isolated and spaced apart from said lower portion of said first conductive layer by said second gate insulation layer, said second conductive layer being further extended outwardly from said upper portion of said first conductive layer toward said first and second diffusion regions of said substrate but isolated from the surface of said substrate by said first and second gate insulation layers having a combined thickness substantially equal to twice a thickness of each of said first and second gate insulation layers individually.

9. The gate-to-drain overlapped MOS transistor of claim 1, wherein said first and second gate insulation layers each has a thickness in the range of approximately 150–200 Å, and said first and second gate insulation layers have a combined thickness in the range of approximately 220–300 Å.

10. The gate-to-drain overlapped MOS transistor of claim 1, wherein said first conductive layer is formed by a poly-crystalline silicon layer having a thickness of approximately 2500 Å at said lower portion, and by stacking a silicide layer of refractory metal having a thickness of approximately 1500 Å at said upper portion on said poly-crystalline silicon layer.

11. The gate-to drain overlapped MOS transistor of claim 1, wherein said second conductive layer comprises a poly-crystalline silicon layer.

12. The gate-to-drain overlapped MOS transistor of claim 1, wherein said first and second gate insulation layers comprise oxide layers.

13. The gate-to-drain overlapped MOS transistor of claim 3, wherein said first conductive layer comprises:

a lower conductive layer made of polysilicon for forming said lower portion exhibiting said first conductive material; and an upper conductive layer made of tungsten silicide and stacked on said lower conductive layer for forming said upper portion exhibiting said second conductive material.

14. The gate-to-drain overlapped MOS transistor of claim 13, wherein said lower conductive layer has a thickness of approximately 2500 Å, and said upper conductive layer has a thickness of approximately 1500 Å.

15. The gate-to-drain overlapped MOS transistor of claim 4, wherein said first conductive layer comprises:

a lower conductive layer made of polysilicon having a thickness of approximately 2500 Å, for forming said lower portion exhibiting said first conductive material; and an upper conductive layer made of fire-resisting metal having a thickness of approximately 1500 Å, for forming said upper portion exhibiting said second conductive material.

16. The gate-to-drain overlapped MOS transistor of claim 5, further comprised of said second gate insulating layer formed above said first doped portion of said first and second diffusion regions being covered by said oxide layer and said second conductive layer.

17. The gate-to-drain overlapped MOS transistor of claim 1, wherein said first conductive layer comprises:

a lower conductive layer formed on said first gate insulation layer over said channel region for forming said lower portion exhibiting said second conductive material; and an upper conductive layer having a thickness substantially greater than one-half of a thickness of said lower conductive layer for forming said upper portion exhibiting said first conductive material.

18. The gate-to-drain overlapped MOS transistor of claim 1, wherein said first conductive layer comprises:

a lower conductive layer of poly-crystalline silicon having a thickness of approximately 2500 Å, formed on said first gate insulation layer over said channel region for forming said lower portion exhibiting said second conductive material; and an upper conductive layer of refractory metal silicide having a thickness of approximately 1500 Å, stacked on said lower conductive layer for forming said upper portion exhibiting said first conductive material.

19. The gate-to-drain overlapped MOS transistor to claim 6, further comprised of said first and second gate insulation layers each having a thickness in the range of approximately 150–200 Å.

20. The gate-to-drain overlapped MOS transistor of claim 6, wherein said first conductive layer comprises:

said lower conductive portion of said first conductive material having a thickness of approximately 2500 Å formed on said first gate insulation layer; and said upper conductive portion of said second conductive material having a thickness of approximately 1500 Å, stacked on said lower conductive portion opposite said first gate insulation layer.

21. The gate-to-drain overlapped MOS transistor of claim 6, wherein said first conductive layer comprises:

said lower conductive portion of poly-crystalline silicon having a thickness of approximately 2500 Å, formed on said first gate insulation layer; and said upper conductive portion of a silicide layer of refractory metal having a thickness of approximately 1500 Å stacked on said lower conductive portion opposite said first gate insulation layer.

22. The gate-to drain overlapped MOS transistor of claim 6, wherein said second conductive layer comprises a poly-crystalline silicon layer.

23. The gate-to-drain overlapped MOS transistor of claim 6, wherein said first and second gate insulation layers comprise oxide layers.

24. The gate-to-drain overlapped MOS transistor of claim 2, comprising said lower portion of said first conductive layer being poly-crystalline silicon, and said upper portion of said first conductive layer being silicide.

25. The gate-to-drain overlapped MOS transistor of claim 2, wherein said first conductive layer comprises:

a lower conductive layer made of polysilicon for forming said lower portion, formed on said first gate insulation layer; and an upper conductive layer being made of a refractory metal silicide forming said upper portion, stacked on said lower conductive layer opposite said first gate insulation layer.

26. The gate-to drain overlapped MOS transistor of claim 2, wherein said second conductive layers comprise poly-crystalline silicon.

27. The gate-to-drain overlapped MOS transistor of claim 2, wherein said first and second gate insulation layers comprise oxide layers each having a thickness in the range of approximately 150–200 Å.

28. The transistor of claim 7, wherein said first conductive layer comprises:

said polysilicon layer having a thickness of approximately 2500 Å for forming said lower portion; and said tungsten silicide layer having a thickness of approximately 1500 Å disposed on said polysilicon layer, for forming said upper portion.

29. The transistor of claim 7, further comprised of said first and second gate insulation layers each having a thickness in the range of approximately 150–200 Å, and said second gate insulation layer being formed after said first conductive layer has been formed on said first gate insulation layer over said channel region.

30. The transistor of claim 8, wherein said first conductive layer comprises:

a polysilicon layer having a thickness of approximately 2500 Å, for forming said lower portion; and a tungsten silicide layer having a thickness of approximately 1500 Å, disposed on said polysilicon layer for forming said upper portion.

31. The transistor of claim 8, further comprised of said first and second gate insulation layers each having a thickness in the range of approximately 150–200 Å, and said second gate insulation layer being formed after said first conductive layer has been formed on said first gate insulation layer over said channel region.

* * * * *

UNITED STATES PATENT AND TRADEMARK OFFICE
CERTIFICATE OF CORRECTION

Page 1 of 2

PATENT NO. : 5,621,236
DATED : April 15, 1997
INVENTOR(S) : Young-Seok Choi, et al.

It is certified that error appears in the above-indentified patent and that said Letters Patent is hereby corrected as shown below:

Column 1,  Line 4,   after the title of the invention (between line 3 and 5), insert --CROSS-REFERENCE TO RELATED APPLICATION--; and Line 36,  after "cross-sectional", change "View" to --view--:

Column 5:

Claim 2,  Line 4,   between "substrate" and "second", insert --by a--;

Claim 4,  Line 65,  after "other", insert --by a--; and

UNITED STATES PATENT AND TRADEMARK OFFICE
CERTIFICATE OF CORRECTION

PATENT NO. : 5,621,236
DATED : April 15, 1997
INVENTOR(S) : Young-Seok Choi, et al.

It is certified that error appears in the above-indentified patent and that said Letters Patent is hereby corrected as shown below:

Column 6:

Claim 4, Line 29, after "diffusion", change "region" to --regions--:

Signed and Sealed this

Twenty-fourth Day of June, 1997

*Attest:*

BRUCE LEHMAN

*Attesting Officer*      *Commissioner of Patents and Trademarks*